US008373285B2

(12) United States Patent
Chen (10) Patent No.: US 8,373,285 B2
(45) Date of Patent: Feb. 12, 2013

(54) CHIP MODULE

(75) Inventor: Jian-Cheng Chen, Tainan County (TW)

(73) Assignee: Advanced Semiconductor Engineering, Inc. (TW)

( * ) Notice: Subject to any disclaimer, the term of this patent is extended or adjusted under 35 U.S.C. 154(b) by 7 days.

(21) Appl. No.: 13/076,947

(22) Filed: Mar. 31, 2011

(65) Prior Publication Data

US 2011/0175240 A1   Jul. 21, 2011

Related U.S. Application Data

(62) Division of application No. 12/230,829, filed on Sep. 5, 2008, now abandoned.

(30) Foreign Application Priority Data

Sep. 11, 2007   (TW) ................................ 96133942 A (51) Int. Cl.
*H01L 23/31*   (2006.01)
(52) U.S. Cl. ........................................ 257/790; 257/783
(58) Field of Classification Search ........... 257/787–795
See application file for complete search history.

(56) References Cited

U.S. PATENT DOCUMENTS

| 6,214,640 B1* | 4/2001 | Fosberry et al. ............. 438/106 |
| 6,313,521 B1* | 11/2001 | Baba ............................. 257/678 |
| 2006/0220256 A1 | 10/2006 | Shim et al. |
| 2006/0226520 A1 | 10/2006 | Yoshimura et al. |
| 2007/0158855 A1 | 7/2007 | Minamio et al. |
| 2008/0099910 A1 | 5/2008 | McLellan et al. |

\* cited by examiner

*Primary Examiner* — Ha Tran T Nguyen
*Assistant Examiner* — Raj R Gupta
(74) *Attorney, Agent, or Firm* — Bacon & Thomas, PLLC (57) ABSTRACT

A chip module and a fabricating method thereof are provided. Firstly, a substrate is provided. Next, a chip is assembled on the substrate and electrically connected with the substrate. Afterward, a plurality of passive units is assembled on the substrate in the style of encircling the chip. Then, a first glue structure is filled between the passive units so that an encircled area is defined by the first glue structure and the passive units. Then, a second glue structure is filled in the encircled area so that the chip is covered by the second glue structure.

20 Claims, 7 Drawing Sheets

CHIP MODULE

This application is a divisional application of co-pending application Ser. No. 12/230,829, filed Sep. 5, 2008, which claims the benefit of Taiwan application Serial No. 96133942, filed Sep. 11, 2007. These related applications are incorporated herein by reference.

BACKGROUND OF THE INVENTION

1. Field of the Invention

The invention relates in general to a chip module and a fabricating method thereof, and more particularly to a chip module with a power amplifier and a fabricating method thereof.

2. Description of the Related Art

How to increase the portability of electronic communication devices is an important trend for the industry of wireless communication, and is also essential to increase product competiveness. The size and weight of electronic communication devices must be reduced in order to increase the portability of electronic communication devices. An electronic communication device s normally has a substrate and the chip is assembled on the substrate by a packaging technology. Thus, the size of the chip package structure directly affects the size of the whole of an electronic product.

Figure 1:
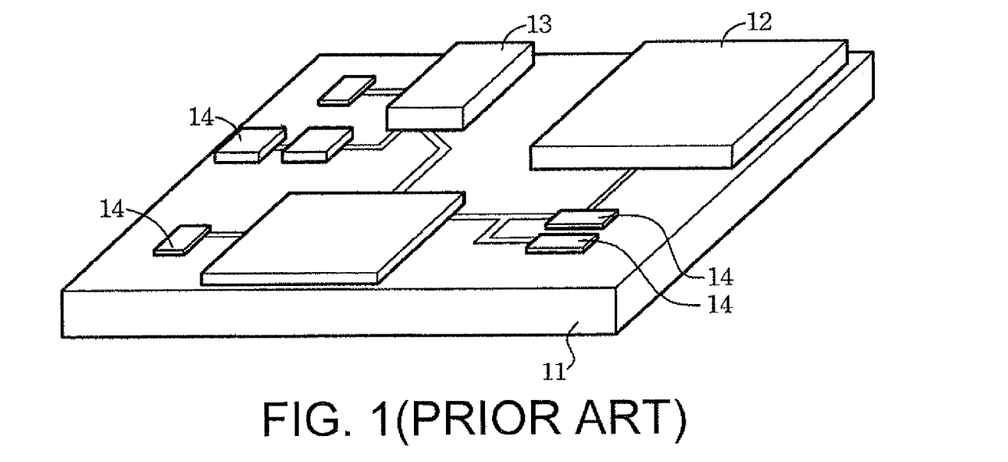
FIG. 1 is a perspective view illustrating a typical wireless module.

FIG. 1 is a perspective view illustrating a typical wireless module 10. Referring to FIG. 1, the wireless module 10 has a substrate 11, at least one chip packaging structure 12, a power amplifier chip 13, and many passive units 14 such as resistors, inductances and capacitors. The passive units 14 are assembled on the substrate 11 by surface mount technology (SMT).

Currently, the power amplifier chip 13 usually applies a IIVV semiconductor chip such as gallium arsenide (GaAs) chip for providing a high frequency signal. Because the power amplifier chip 13 is usually used in a strict high frequency environment, the flip-chip technology or wireless chip level (WLCSP) package is unsuitable for assembling the chip 13 on the substrate 11. In general, the power amplifier chip is adhered to the substrate 11, and wires are used for electrically connecting the power amplifier chip with the substrate 11. Then, the power amplifier chip is buried in a packaging material. Further, the wires must be buried in a packaging material for avoiding the exposed wires causing an antenna to excite energy.

Figure 2A:
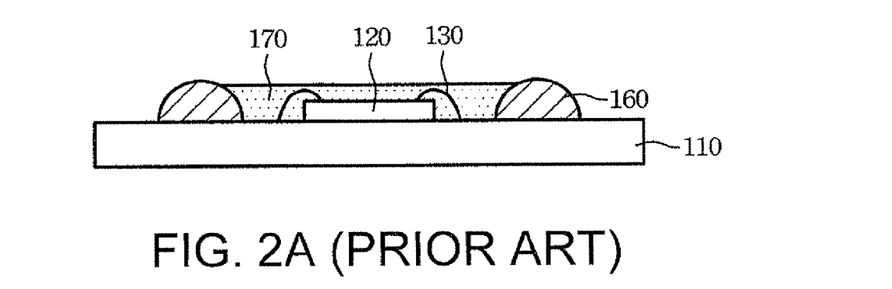
FIGS. 2A and 2B are perspectives view illustrating a typical power amplifier package structure.
Figure 2B:
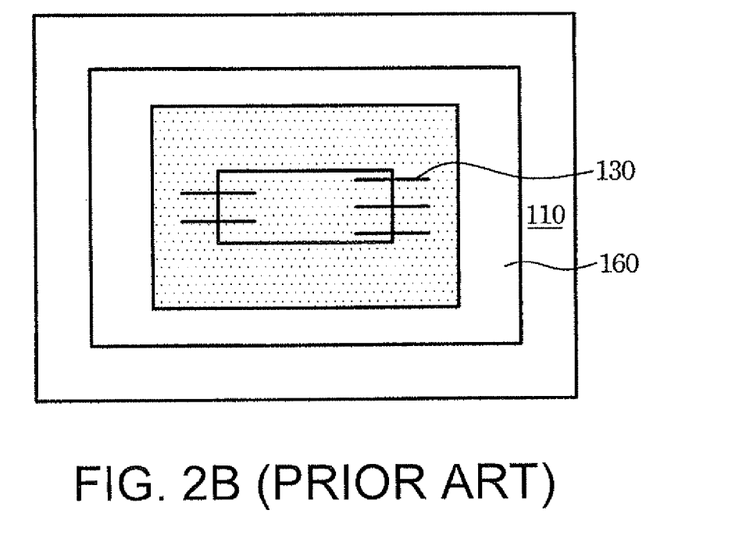

FIGS. 2A and 2B are respectively a cross-sectional view and top view illustrating the package structure of a typical power amplifier chip. Referring to FIGS. 2A and 2B, a dam structure 160 encircling the power amplifier chip 120 is formed on the substrate 110. The space encircled by the dam structure 160 with the packaging material 170 for encircling the power amplifier chip 120 and the wires 130 and for providing the power amplifier chip 120 and the wires 130 with necessary insulation protection. The above package structure is capable of appropriately packaging the power amplifier chip 120 in the wireless module 10. However, during manufacturing the dam structure 160, a predetermined space on the substrate 110 must be reserved for manufacturing the dam structure 160. Therefore, the dam structure 160 will certainly increase the size of the package structure and jeopardize the portability of electronic devices.

Thus, the invention provides a chip module and a fabricating method thereof capable of appropriately packaging the power amplifier chip 120 in the chip module and avoiding unnecessary increase in the size of the package structure.

SUMMARY OF THE INVENTION

The invention is directed to a chip module and a fabricating method thereof. A power amplifier is packaged in the chip module, such that the wires can do without insulation and the size of the package structure will not increase due to the insulation.

According to a first aspect of the present invention, a chip module is provided. The chip module comprises a substrate, a chip, a plurality of passive units, a first glue structure and a second glue structure. The chip is assembled on the substrate and electrically connected with the substrate. A plurality of passive units is assembled on the substrate in the style of encircling the chip. The first glue structure is filled between the passive units so that an encircled area is defined by the first glue structure and the passive units. The second glue structure is filled within the encircled area so that the chip is covered by the second glue structure.

According to a second aspect of the present invention, a method of fabricating chip module is provided. The method comprises the following steps. (a) A substrate is provided. (b) A chip is assembled on the substrate and electrically connected with the substrate. (c) A plurality of passive units is assembled on the substrate in the style of encircling the chip. (d) A first glue structure is filled between the passive units so that an encircled area is defined by the first glue structure and the passive units. (e) A second glue structure is filled within the encircled area so that the chip is covered by the second glue structure.

The invention will become apparent from the following detailed description of the preferred but non-limiting embodiments. The following description is made with reference to the accompanying drawings.

DETAILED DESCRIPTION OF THE INVENTION

Figure 3:
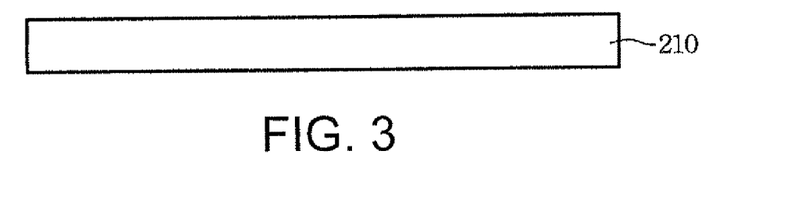
FIGS. 3, 4, 5A, 5B, 6A, 6B and 7 are views illustrating a fabricating method of a chip module in accordance with a first preferred embodiment of the present invention.
Figure 4:
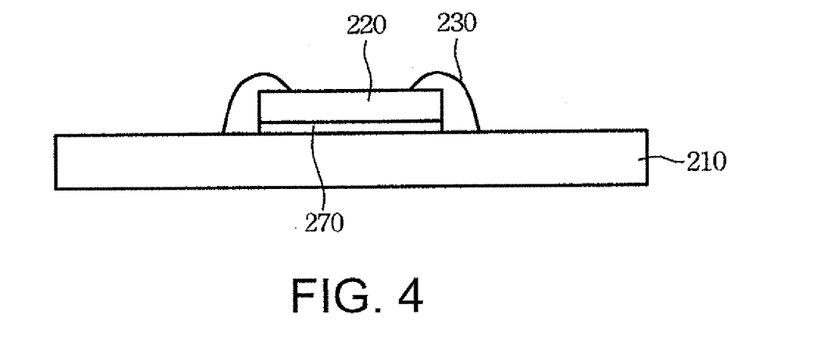

FIGS. 3~7 are a first preferred embodiment of a fabricating method of a chip module 200 of the invention. Firstly, as indicated in FIG. 3, a substrate 210 is provided. Next, an adhesive layer 270 is disposed on the substrate 210, and a chip 220, such as a power amplifier chip, is assembled on an adhesive layer 270. The chip 220 is adhered to the substrate 210 via the adhesive layer 270. Afterward, as indicated in FIG. 4, a plurality of wires 230 is disposed for connecting a contact pad (not illustrated) disposed on the chip 220 with a conductive pattern (not illustrated) disposed on the substrate 210, such that the signal generated by the chip 220 can be transmitted to the substrate 210 via the wires 230 and further transmitted outward from the substrate 210.

Figure 5A:
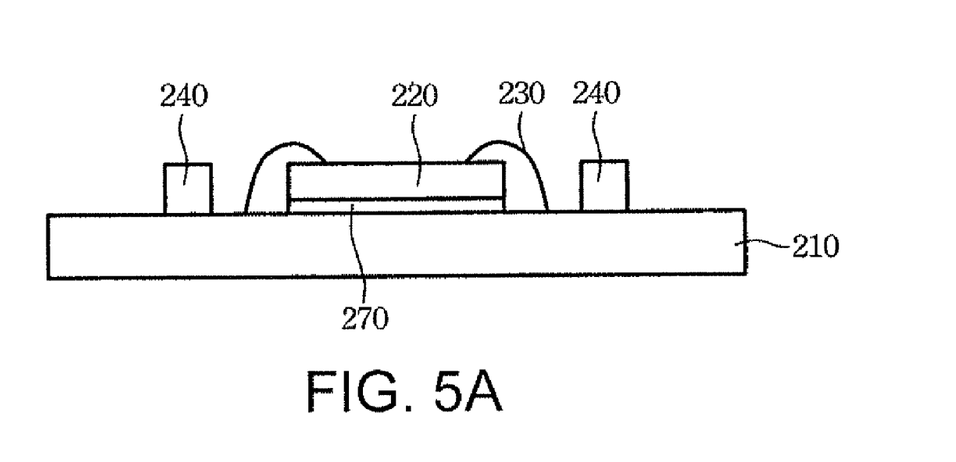
Figure 5B:
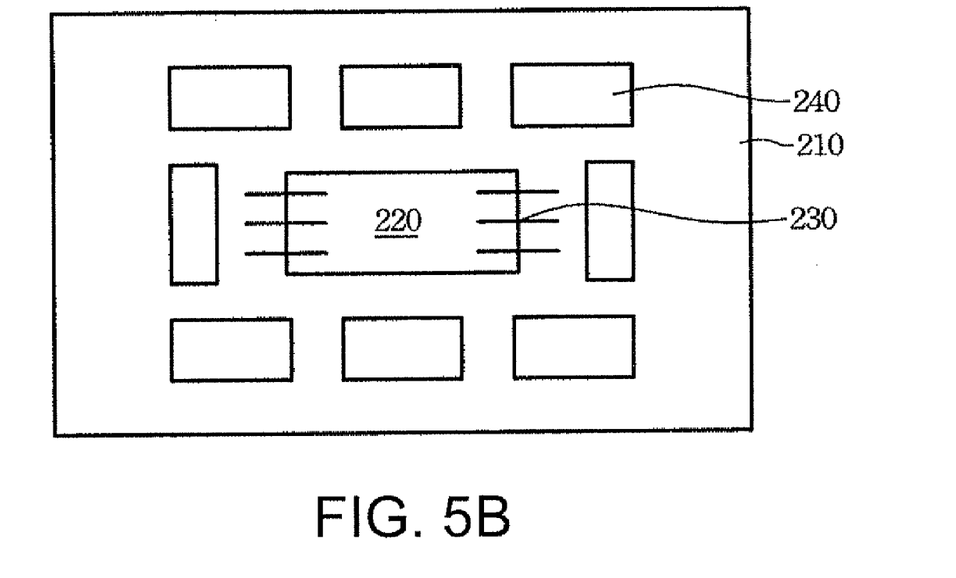

Next, as indicated in FIGS. 5A and 5B, a plurality of passive units 240 is assembled on the substrate 210 in the style of encircling the chip. In a preferred embodiment, the passive units 240 can be assembled on the substrate 210 by surface mount technology (SMT).

Figure 6A:
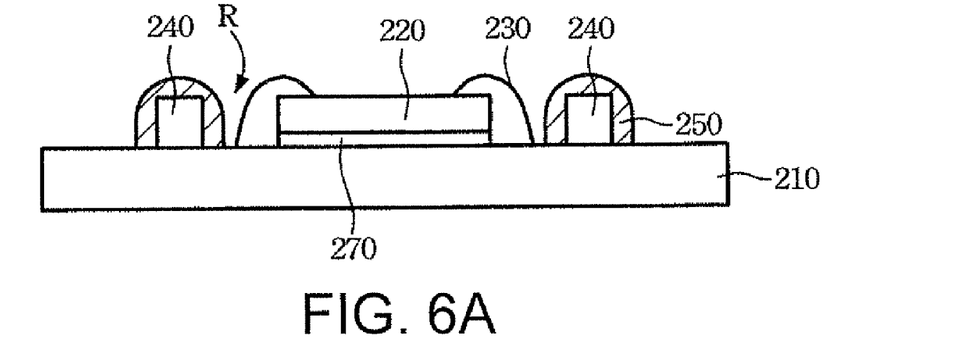
Figure 6B:
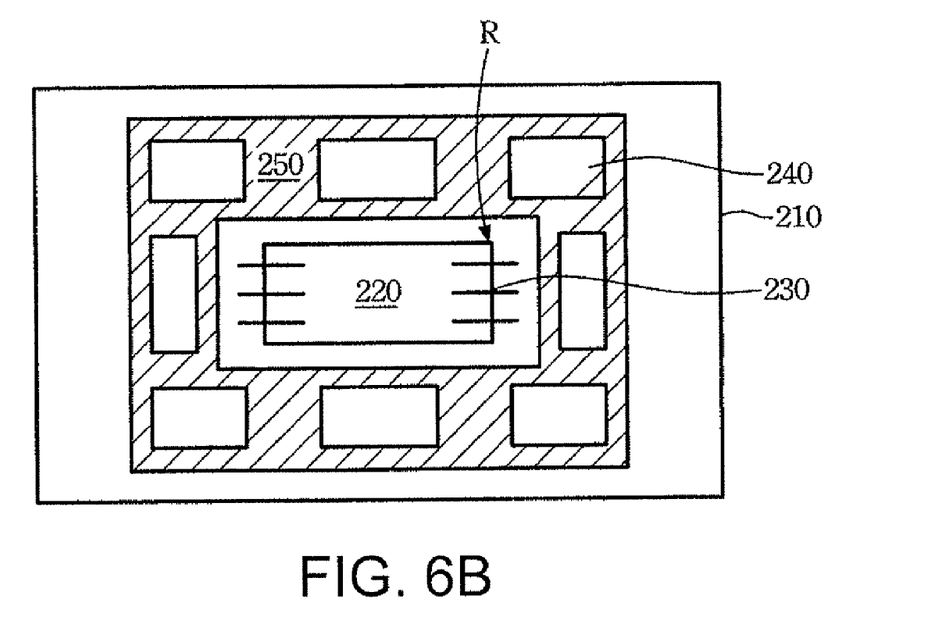
Figure 7:
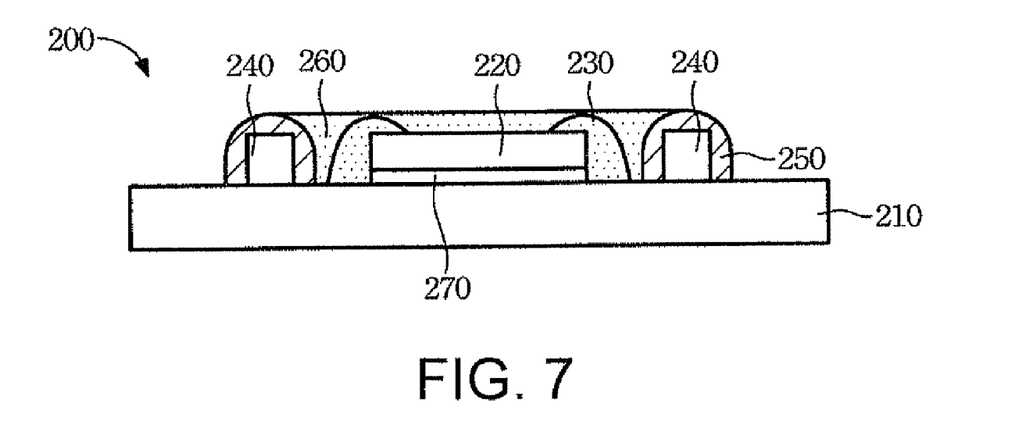

Afterward, as indicated in FIGS. 6A and 6B, a first glue structure 250 is filled between the passive units 240. In the present embodiment of the invention, the first glue structure 250 completely covers each of the passive units 240. An encircled area R is defined by the first glue structure 250 and the passive units 240 for encircling the chip 220 and the wires 230. The chip 220 and the wires 230 are located within the encircled area R. Next, as indicated in FIG. 7, a second glue structure 260 is filled within the encircled area R for covering the chip 220 and the wires 230, so that the chip 220 and the wires 230 are isolated from the outside.

The first glue structure 250 and the second glue structure 260 can be made from different materials, respectively. In a preferred embodiment; the first glue structure 250 is filled between the passive units 240 for defining the encircled area R. For the convenience in the manufacturing process, the first glue structure 250 is preferably made from an easy-forming material with high adhesiveness. On the other side, For making sure that the second glue structure 260 can effectively bury the wires 230, the second glue structure 260 is preferably made from a material with high fluidity. Thus, viscosity of the first glue structure 250 preferably is higher than viscosity of the second glue structure 260.

Figure 8A:
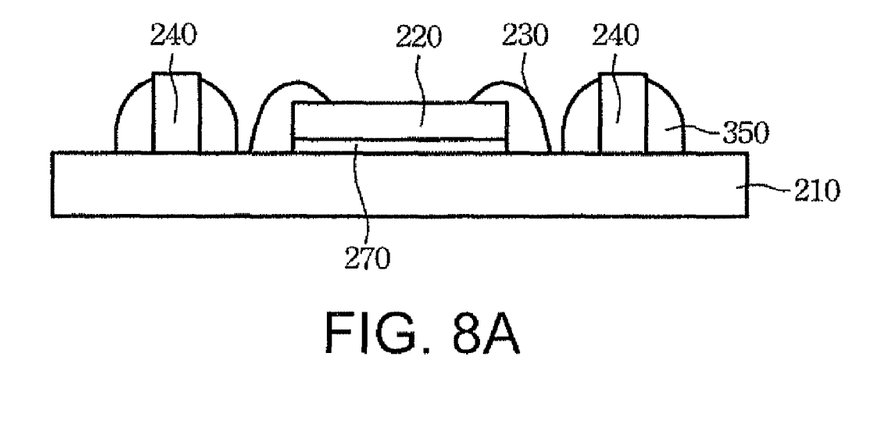
FIGS. 8A and 8B are views illustrating a fabricating method of the chip module in accordance with a second preferred embodiment of the present invention.
Figure 8B:
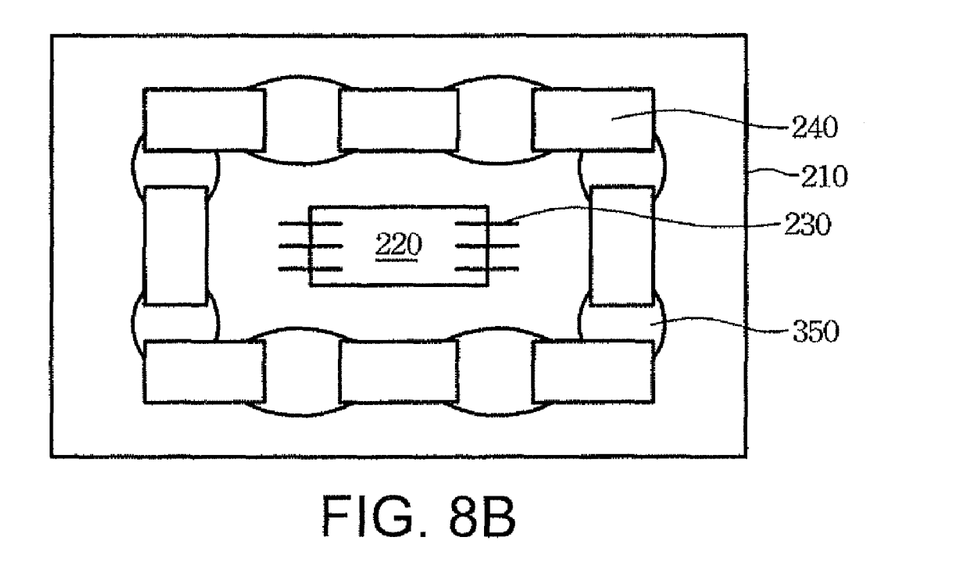

Then, as indicated in FIGS. 6A and 6B, in the present embodiment of the invention, each of the passive units 240 is completely buried in the first glue structure 250. However, the invention is not limited thereto. As indicated in FIGS. 8A and 8B, in a second embodiment of the invention, the first glue structure 350 is filled in the gap between neighboring passive units 240. Parts of the lateral sides and top surface of the passive units 240 are still exposed. In the present embodiment of the invention, the passive units 240 and the first glue structure 350 still define an encircled area to accommodate the chip 220 and the wires 230.

Figure 9:
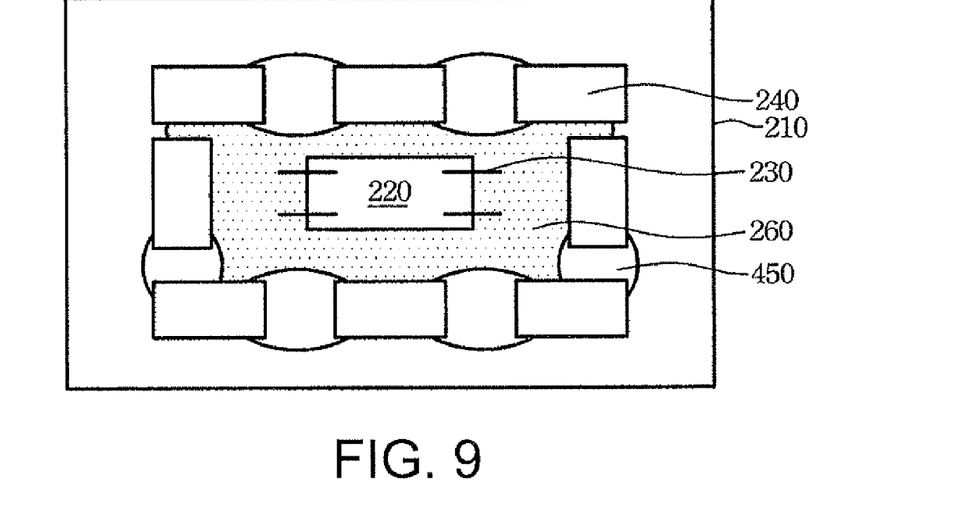
FIG. 9 is a view illustrating a fabricating method of the chip module in accordance with a third preferred embodiment of the present invention.

The formation of an encircled area is not compulsory in the invention. As indicated in FIG. 9, in a third embodiment of the invention, despite the first glue structure 450 is filled between the passive units 240, the first glue structure 450 and the passive units 240 do not form an encircled area for accommodating the chip 220 and the wires 230. However, the first glue structure 450 and the passive units 240 still define an internal space. In the present embodiment of the invention, the second glue structure is preferably made from a material with high adhesiveness for avoiding the second glue structure (not illustrated) overflowing outward onto the first glue structure 450 and the passive units 240.

Figure 10:
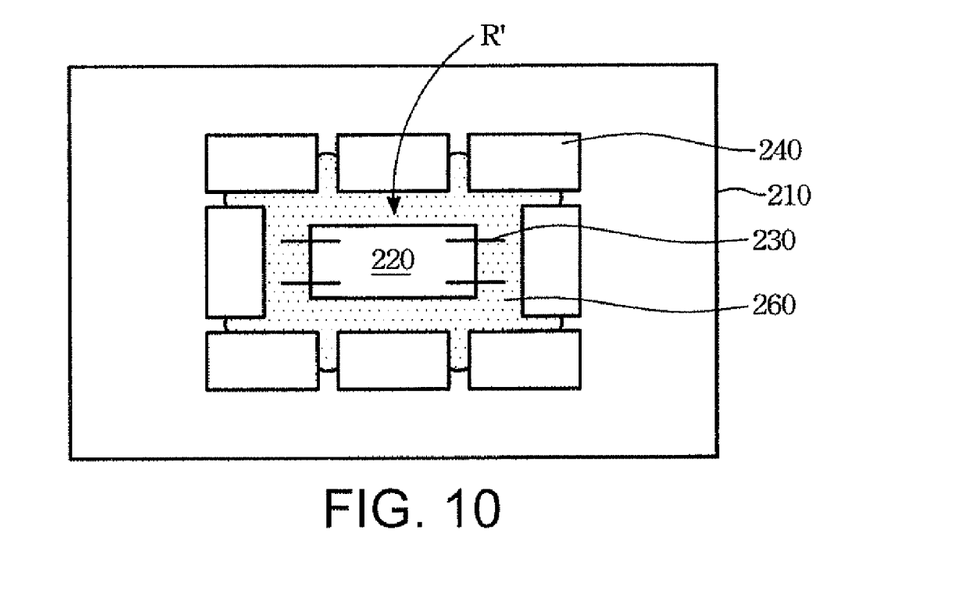
FIG. 10 is a view illustrating a fabricating method of the chip module in accordance with a fourth preferred embodiment of the present invention.

As indicated in FIG. 10, in a third embodiment of the invention, if the passive units 240 are closely arranged, then the passive units 240 can be used as a shield and the second glue structure is filled between the passive units 240 for defining an encircled area R' such that the package structure is completed without filling the first glue structure 250 between the passive units 240. However, in the present embodiment of the invention, the second glue structure is preferably made from a material with high adhesiveness for avoiding the second glue structure overflowing outward onto the first glue structure 450 and the passive units 240.

As indicated in FIGS. 2A and 2B, conventional packaging method employs an additional dam structure 160 to protect the power amplifier chip 120 assembled on the substrate 110. However, such dam structure 160 increases the size of the package structure and jeopardizes the portability of the chip module. Compared with the conventional method, the invention defines an encircled area by the passive units 240 and the first glue structures 250,350,450, and then the second glue structure 260 is filled within the encircled space to finish the package structure with the power amplifier chip 220. As a result, the invention omits the dam structure which is used in conventional packaging methodand reduces the size of the chip module.

While the invention has been described by way of example and in terms of a preferred embodiment, it is to be understood that the invention is not limited thereto. On the contrary, it is intended for covering various modifications and similar arrangements and procedures, and the scope of the appended claims therefore should be accorded the broadest interpretation so as to encompass all such modifications and similar arrangements and procedures.

What is claimed is:

1. A chip module, comprising:
    a substrate;
    a chip assembled on the substrate and electrically connected with the substrate;
    a plurality of passive units assembled on the substrate in the style of encircling the chip;
    a plurality of first glue structures filled between the passive units, wherein the number of the passive units is larger than the number of the first glue structures, so that parts of the passive units are exposed from the first glue structures; and
    a second glue structure filled within an encircled area defined by the first glue structures, at least one gap between adjacent two passive units and the exposed parts of the passive units, so that the chip is covered by the second glue structure.

2. The chip module according to claim 1, wherein the width of the gap is smaller than the distance between the adjacent two passive units which are connected by one of the first glue structures.

3. The chip module according to claim 1, wherein the encircled area has a corner, and the gap is at the corner.

4. The chip module according to claim 1, wherein the gap is partially filled by the second glue structure.

5. The chip module according to claim 1, further comprising an adhesive layer disposed between the chip and the substrate, wherein the chip is a power amplifier chip.

6. The chip module according to claim 1, further comprising a plurality of wires electrically connected with the chip and the substrate, wherein the wires are buried in the second glue structure.

7. The chip module according to claim 1, wherein some of the passive units are partially covered by the first glue structures.

8. The chip module according to claim 1, wherein some of the passive units have two opposite ends buried in the first glue structures.

9. The chip module according to claim 1, wherein some of the passive units have one end buried in the first glue structures.

10. The chip module according to claim 1, wherein some of the passive units are fully buried in the first glue structures.

11. The chip module according to claim 1, wherein the constituent of the first glue structures is different from that of the second glue structure.

12. The chip module according to claim 1, wherein the viscosity of the first glue structures is higher than the viscosity of the second glue structure.

13. A chip module, comprising:
a substrate;
a chip assembled on the substrate and electrically connected with the substrate;
a plurality of passive units assembled on the substrate in the style of encircling the chip, wherein some of the passive units are spaced apart by a first distance and some of the passive units are spaced apart by a second distance smaller than the first distance;
a plurality of first glue structures filled between the passive units spaced apart by the first distance, so that parts of the passive units are exposed from the first glue structures; and
a second glue structure filled within an encircled area defined by the first glue structures, at least one gap between the passive units spaced apart by the second distance, and the exposed parts of the passive units so that the chip is covered by the second glue structure.

14. The chip module according to claim 13, wherein the encircled area has a corner, and the gap is at the corner.

15. The chip module according to claim 13, wherein the gap is partially filled by the second glue structure.

16. The chip module according to claim 13, wherein each of the passive units spaced apart by the first distance has at lease one end buried in the first glue structures.

17. The chip module according to claim 13, further comprising a plurality of wires electrically connected with the chip and the substrate, wherein the wires are buried in the second glue structure.

18. The chip module according to claim 13, wherein the constituent of the first glue structures is different from that of the second glue structure, and the viscosity of the first glue structures is higher than the viscosity of the second glue structure.

19. The chip module according to claim 13, wherein the encircled area is a rectangle having two opposite sides and two other sides adjoining the two opposite sides, and the first glue structures are disposed on the two opposite sides.

20. The chip module according to claim 19, wherein the gap is disposed on each of the two other sides.

* * * * *